(12) United States Patent
Mayuzumi et al.

(10) Patent No.: US 8,980,713 B2
(45) Date of Patent: Mar. 17, 2015

(54) METHOD FOR FABRICATING A METAL HIGH-K GATE STACK FOR A BURIED RECESSED ACCESS DEVICE

(71) Applicant: Sony Corporation, Tokyo (JP)

(72) Inventors: Satoru Mayuzumi, Boise, ID (US);
Mark Fischer, Meridian, ID (US);
Michael Violette, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/907,001

(22) Filed: May 31, 2013

(65) Prior Publication Data

US 2014/0357033 A1    Dec. 4, 2014

(51) Int. Cl.
*H01L 21/336*  (2006.01)
*H01L 21/28*   (2006.01)
*H01L 21/265*  (2006.01)
*H01L 29/66*   (2006.01)

(52) U.S. Cl.
CPC ........ *H01L 21/28008* (2013.01); *H01L 21/265* (2013.01); *H01L 29/66545* (2013.01); *H01L 29/66666* (2013.01)

USPC .......... 438/270; 438/259; 438/271; 438/272; 438/589; 257/E21.428

(58) Field of Classification Search
None
See application file for complete search history.

(56) References Cited

U.S. PATENT DOCUMENTS

| | | | |
|---|---|---|---|
| 2008/0090357 A1* | 4/2008 | Tai et al. | 438/270 |
| 2008/0268588 A1* | 10/2008 | Anderson et al. | 438/218 |
| 2009/0065809 A1* | 3/2009 | Yamakawa | 257/190 |
| 2010/0240183 A1* | 9/2010 | Narazaki | 438/270 |
| 2011/0210389 A1* | 9/2011 | Griebenow et al. | 257/330 |
| 2013/0049103 A1* | 2/2013 | Schloesser et al. | 257/330 |

* cited by examiner

*Primary Examiner* — Angel Roman
(74) *Attorney, Agent, or Firm* — Moser Taboada

(57) ABSTRACT

A method for fabricated a buried recessed access device comprising etching a plurality of gate trenches in a substrate, implanting and activating a source/drain region in the substrate, depositing a dummy gate in each of the plurality of gate trenches, filling the plurality of gate trenches with an oxide layer, removing each dummy gate and depositing a high-K dielectric in the plurality of gate trenches, depositing a metal gate on the high-K dielectric in each of the plurality of gate trenches, depositing a second oxide layer on the metal gate and forming a contact on the source/drain.

15 Claims, 18 Drawing Sheets

METHOD FOR FABRICATING A METAL HIGH-K GATE STACK FOR A BURIED RECESSED ACCESS DEVICE

FIELD

Certain embodiments of the disclosure relate to nonvolatile memory and dynamic random access memory (DRAM). More specifically, certain embodiments of the disclosure relate to a method and apparatus for fabricating a metal/high-k gate stack for a buried recessed access device.

BACKGROUND

Many types of electronic devices include data cells having a single transistor. Typically, the transistor controls whether a stimulus (e.g., a current or voltage) is applied to, or by, a data element (e.g., a memory element, an imaging element, or other device configured to output data, such as various kinds of sensors). Often a large number of data elements are disposed in an array, and the transistor allows individual data elements in the array to be selected. For example, certain types of dynamic random access memory (DRAM) cells include both a capacitor, which functions as a data element, and a single transistor, which functions as an access device, connected to the capacitor. The capacitor usually stores data by storing a charge that is representative of data (e.g., a 0 or a 1 in a single-bit device, or a 00, 01, 10, or 11 in a two-bit device), and the transistor typically controls access to the capacitor by controlling the flow of current to and from the capacitor, allowing current to flow during reading and writing and preventing current from flowing when retaining data.

Often the data elements are arranged in an array, e.g., generally in rows and columns. Data cells within the array are accessed, e.g., written to or read from, through circuitry near the periphery of the array. For instance, sense amplifiers or other sensing circuitry are often positioned adjacent arrays of data cells for reading data. Similarly, address decoders, e.g., row and column address decoders, are often disposed adjacent the array for addressing particular data cells or groups of data cells.

As the footprints of such devices become smaller, the components of the device may become smaller and/or denser for a given storage capacity. Additionally, some structures may be more vertical (i.e., less planar with respect to the substrate) to reduce footprint size. In such devices, construction of the data elements and the support structures (e.g., digitlines, wordlines, etc.) may present challenges and may limit scaling such devices to smaller footprints and higher densities.

Further, in conventional device formation, polysilicon layers are used as gate electrodes. However, the polysilicon layers must be doped in order to achieve a desired work function. Unfortunately, polysilicon gate electrodes suffer from a depletion effect. The depletion effect occurs when the portion of the gate electrode nearest an underlying oxide layer is depleted of dopants, causing the gate electrode layer to behave like an insulating layer, leading to device degradation and eventual malfunction. Silicon oxide is commonly used as an insulating layer. A thinner silicon oxide is required to increase gate capacitance, causing high drive current. However thin silicon oxide causes high gate leakage current, leading to excessive power consumption in mobile devices. For high performance CMOS applications where high-k dielectric layers are applied as a replacement for silicon oxide, the polysilicon gate interacts with the high-k film because of the Fermi pinning effect, resulting in a high threshold voltage and poor transistor drive performance. Metal layers are needed as gate electrodes if high-k dielectric layers are used for CMOS transistors. The work function close to Si band edges is effective to achieve low threshold voltage for CMOS transistors. However the work function shifts to the band middle from the band edge if a high temperature treatment is performed after the formation of the gate electrode.

Therefore, there is a need in the art for a method and apparatus for fabricating a metal/high-k gate stack with a low temperature process for a buried recessed access device.

SUMMARY

An apparatus and/or method is provided for fabricating a metal/high-k gate stack for a buried recessed access device substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIGS. 1-6 together illustrate a first process for fabricating a gate for a buried recess access device (BRAD) in accordance with embodiments of the present invention, where:

FIG. 3 illustrates a third step in the process of fabricating a gate for a BRAD in accordance with exemplary embodiments of the present invention;

FIG. 4 illustrates a fourth step in the process of fabricating a gate for a BRAD in accordance with exemplary embodiments of the present invention;

FIG. 6 illustrates a sixth step in the first process of fabricating a gate for a BRAD in accordance with exemplary embodiments of the present invention.

FIGS. 7-12 together illustrate a second process for fabricating a gate for a BRAD in accordance with embodiments of the present invention, where:

FIG. 8 illustrates a second step in the second process of fabricating a gate for a BRAD according to an exemplary embodiment of the present invention;

FIG. 9 illustrates a third step in the second process of fabricating a gate for a BRAD according to an exemplary embodiment of the present invention;

FIG. 10 illustrates a fourth step in the second process of fabricating a gate for a BRAD according to an exemplary embodiment of the present invention;

FIG. 12 illustrates a sixth and final step in the second process of fabricating a gate for a BRAD;

DETAILED DESCRIPTION

Certain implementations may be found in an apparatus and/or method for fabrication of a metal/high k dielectric gate stack for a buried recess access devices (BRAD). According to one embodiment, a dummy gate made of silicon oxide is formed, along with an electrode composed of polysilicon. Silicidation is performed and then silicon nitride is deposited on the silicide. The dummy gate electrode and oxide are then removed, and a metal/high k dielectric gate is deposited in the trenches, along with the contacts for the source/drain of the transistor. FIGS. 1-6 depict a first process for forming a BRAD in accordance with exemplary embodiments of the present invention. FIGS. 7-12 depict a second process for formation of the BRAD in accordance with exemplary embodiments.

Figure 1A:
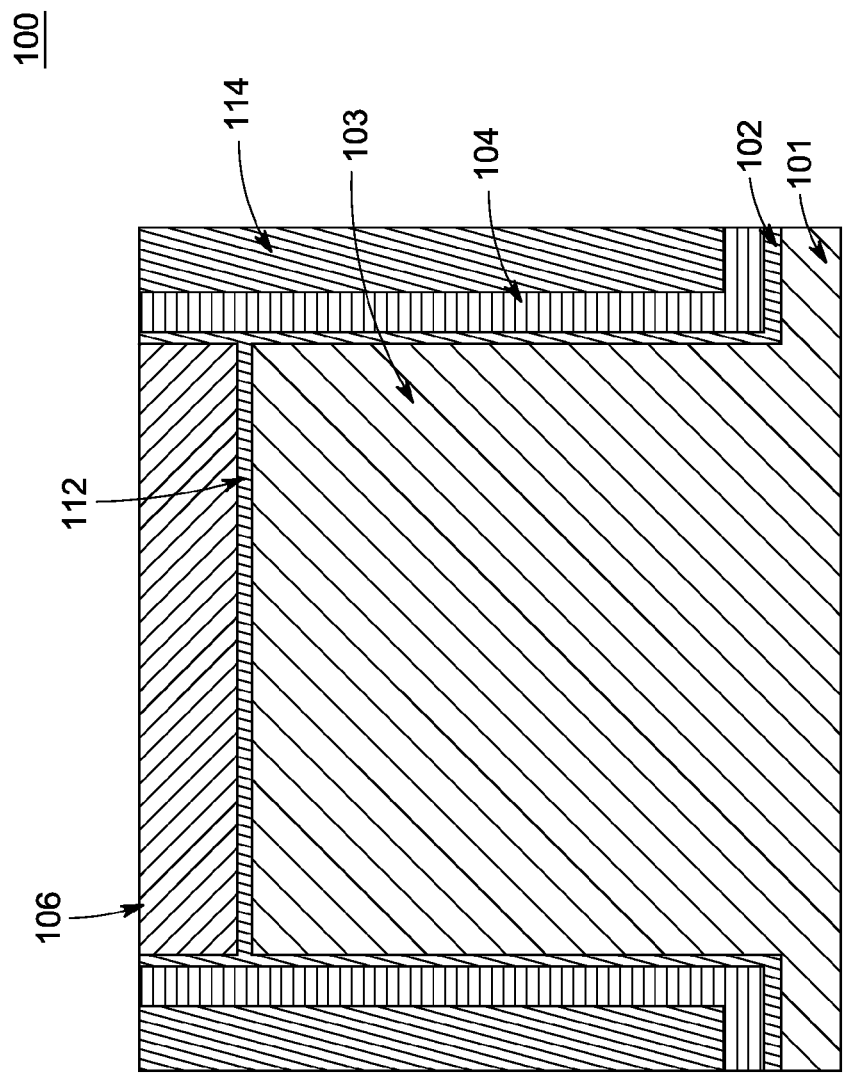
FIGS. 1A-1B illustrates a first step in a process for fabricating a gate for a BRAD for nonvolatile and dynamic RAM in accordance with exemplary embodiments of the present invention.
Figure 1B:
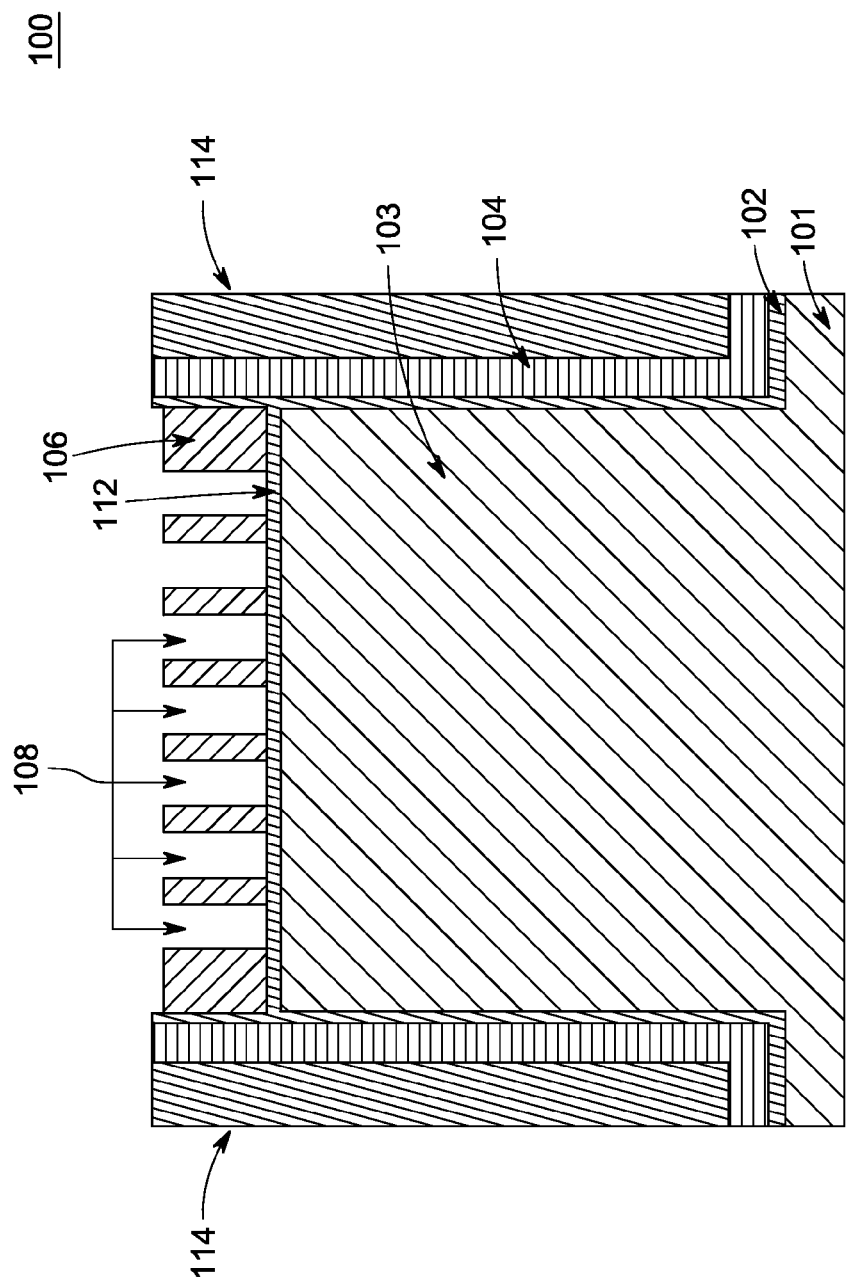

FIGS. 1A-1B illustrate a first step in a process for fabricating a gate for a BRAD for nonvolatile and dynamic RAM in accordance with exemplary embodiments of the present invention. The fabricated BRAD may generally comprise a shallow trench isolation (STI) to form a silicon region 103 in a substrate 101. A silicon oxide 112 and a polysilicon layer 106 are deposited on the substrate 101. The STI is then formed by silicon oxide 102 and silicon nitride 104 and silicon oxide 114, disposed atop the substrate 101. BRADs and other devices like transistors, capacitors and resistors in substrate 101 are isolated by the STI. The substrate 101 may be a silicon substrate, for example crystalline silicon (e.g., Si<100> or Si<111>), strained silicon, doped or undoped polysilicon, a III-V or II-VI compound substrate, a silicon germanium (SiGe) substrate, an epi-substrate, a silicon-on-insulator (SOI) substrate or the like. If the devices in the substrate 101 are electrically isolated, the silicon nitride is optional.

FIG. 1 depicts a mask used to etch the gate trench for the BRAD transistor 100 into a silicon substrate 101 and the STI. The BRAD 100 is used to form the buried wordlines on the substrate 101. According to exemplary embodiments of the present invention, an additional STI (not shown) is also formed in the back of the silicon region 103 to adjust the width of the BRAD.

The polysilicon 106 is patterned using a masking material (not shown) for forming trenches 108. The formed trenches 108 are initially patterned on the polysilicon layer 106 via photolithography or other lithographic processes. The trenches 108 are formed by using a hard mask, deposited on the polysilicon layer 106, such as photoresist to define exposed regions. The defined exposed regions have a width similar to the width of the eventually formed trenches 108 and may be patterned with any lithographic process.

The trenches 108 are formed atop the substrate 101 with a dry etch or other suitable etch process that etches the polysilicon layer 106, but does not etch the oxide layer 112 deposited on the silicon region 103, leaving portions of the polysilicon layer 106. The mask and any excess material may be removed from the substrate 100 via a hydrofluoric acid clean or other suitable process.

Figure 2A:
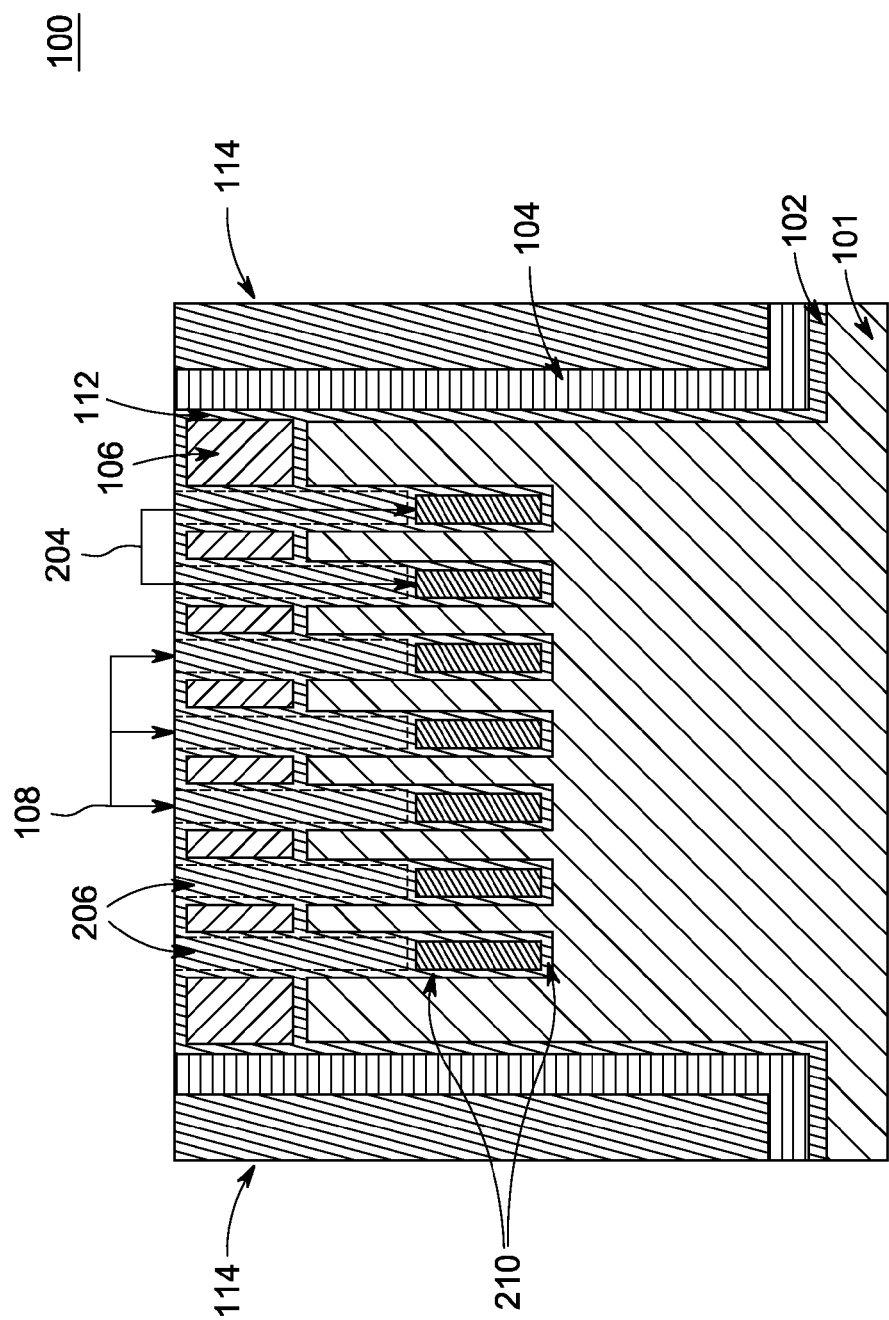
FIGS. 2A-2C illustrate a second step of the process for fabricating a gate for a BRAD in accordance with exemplary embodiments of the present invention.
Figure 2B:
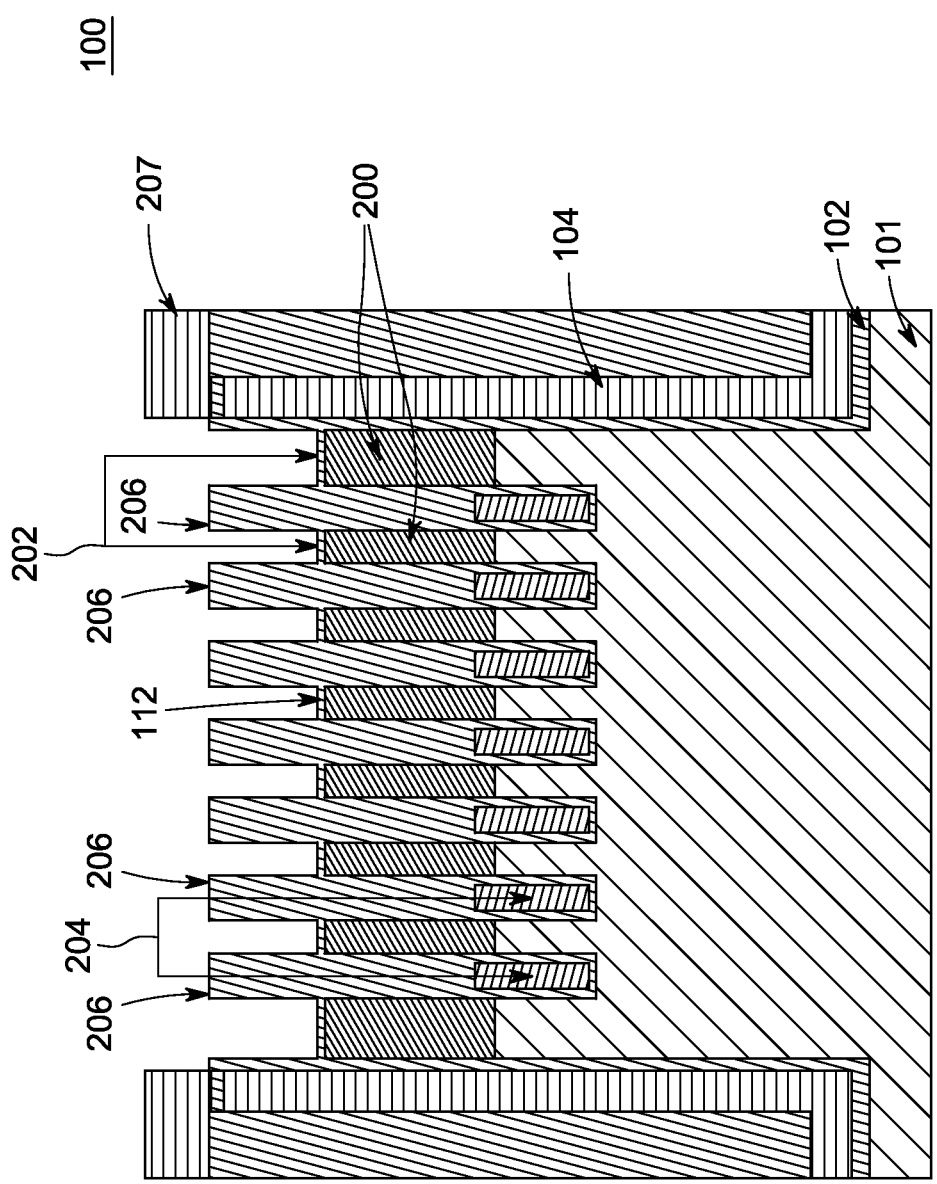
Figure 2C:
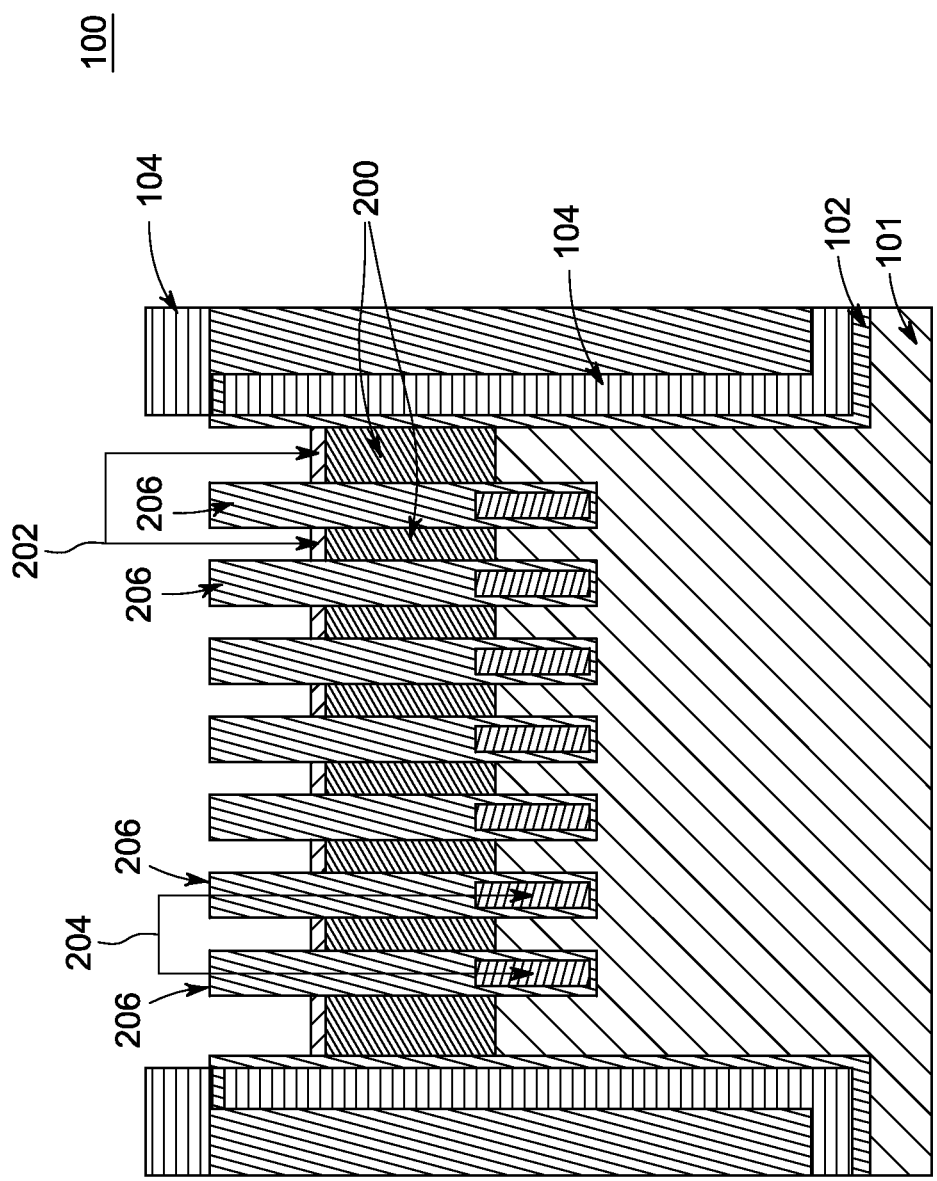

FIGS. 2A-2C illustrate a second step of the process for fabricating a gate for a BRAD in accordance with exemplary embodiments of the present invention. FIG. 2A depicts extending the trenches 108, etching into the substrate 101. Once the trenches 108 are etched, another oxide layer 210 is deposited in the trenches 108. Polysilicon is then deposited in the trenches 108 on the oxide layer 210. Subsequently, the polysilicon 106 is only etched to form the dummy gate electrodes 204. Another oxide layer 206 is deposited on the dummy gate electrodes 204 to fill the trenches 108.

FIG. 2B depicts implanting a source/drain region 200 in the substrate 101. A silicon nitride 207 is deposited on the substrate 101. Then the silicon nitride 207 is etched only on the region 103 with lithograph pattern (not shown) and the polysilicon 106 is selectively removed by dry etch or wet etch to expose the oxide 112 and implant the source/drain region 200 next to each of the trenches 108. Then a thermal treatment is performed to activate the implanted impurities in the source/drain regions 200. The process temperature is greater than 1000 degree C.

FIG. 2C depicts the formation of silicide on the source/drain region 200. The silicon oxide 112 is removed on the source/drain region 200. Silicidation is then performed on the source/drain regions 200 to form a silicide layer 202. Ti, Co, Ni and Pt are used for the silicidation process with some thermal treatment greater than 500 degree C. and cleaning steps to form the silicidation layer, according to well-known conventional processes.

Figure 3:
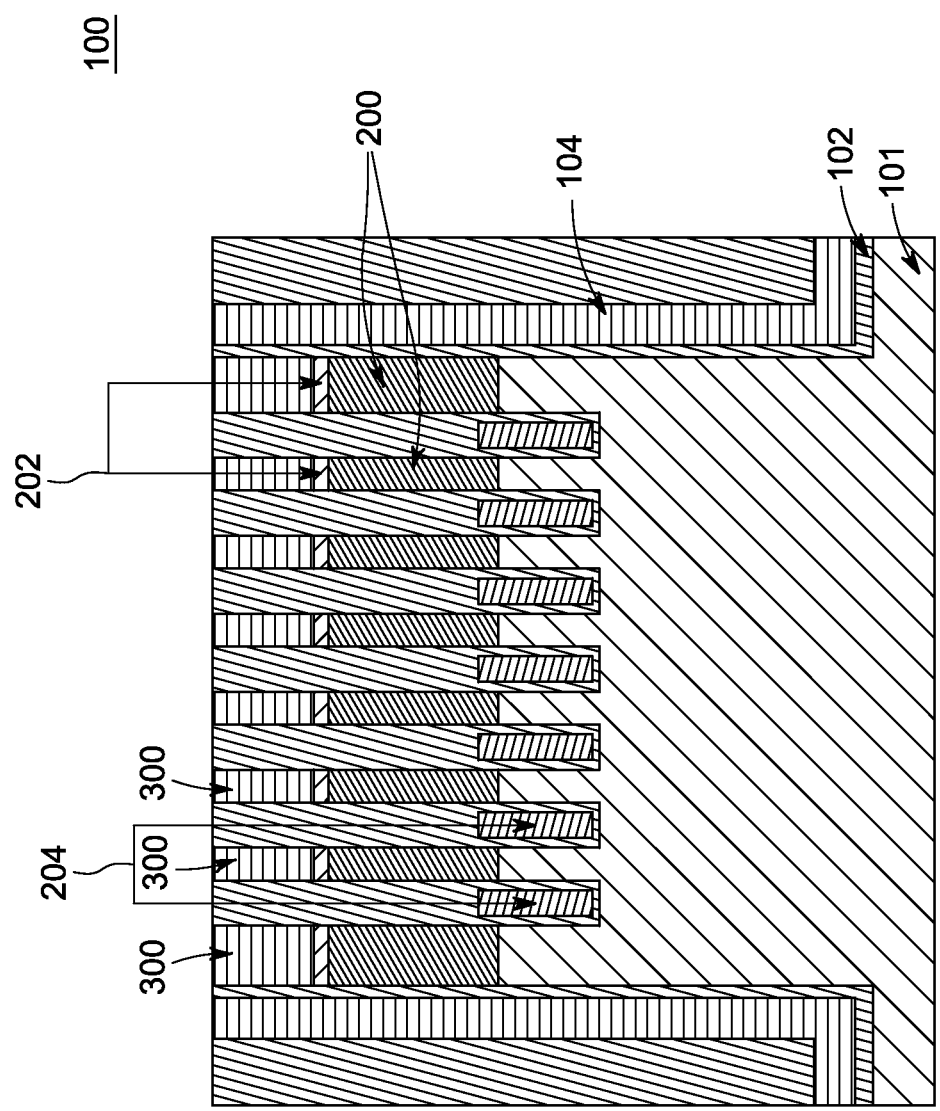

FIG. 3 illustrates a third step in the process of fabricating a gate for a BRAD in accordance with exemplary embodiments of the present invention. FIG. 3 depicts depositing silicon nitride 300 over the structure created thus far. The silicon nitride fills the gaps between oxide regions of the gate electrode. Subsequently, because the surface of the silicon nitride is not planar, the surface of the silicon nitride layer 300 is planarized via chemical mechanical planarization (CMP) or other suitable planarization processes known to those of ordinary skill in the art. The CMP process smooths the surface of the silicon nitride 300 using chemical etching and free abrasive polishing and removes the silicon nitride 104.

Figure 4:
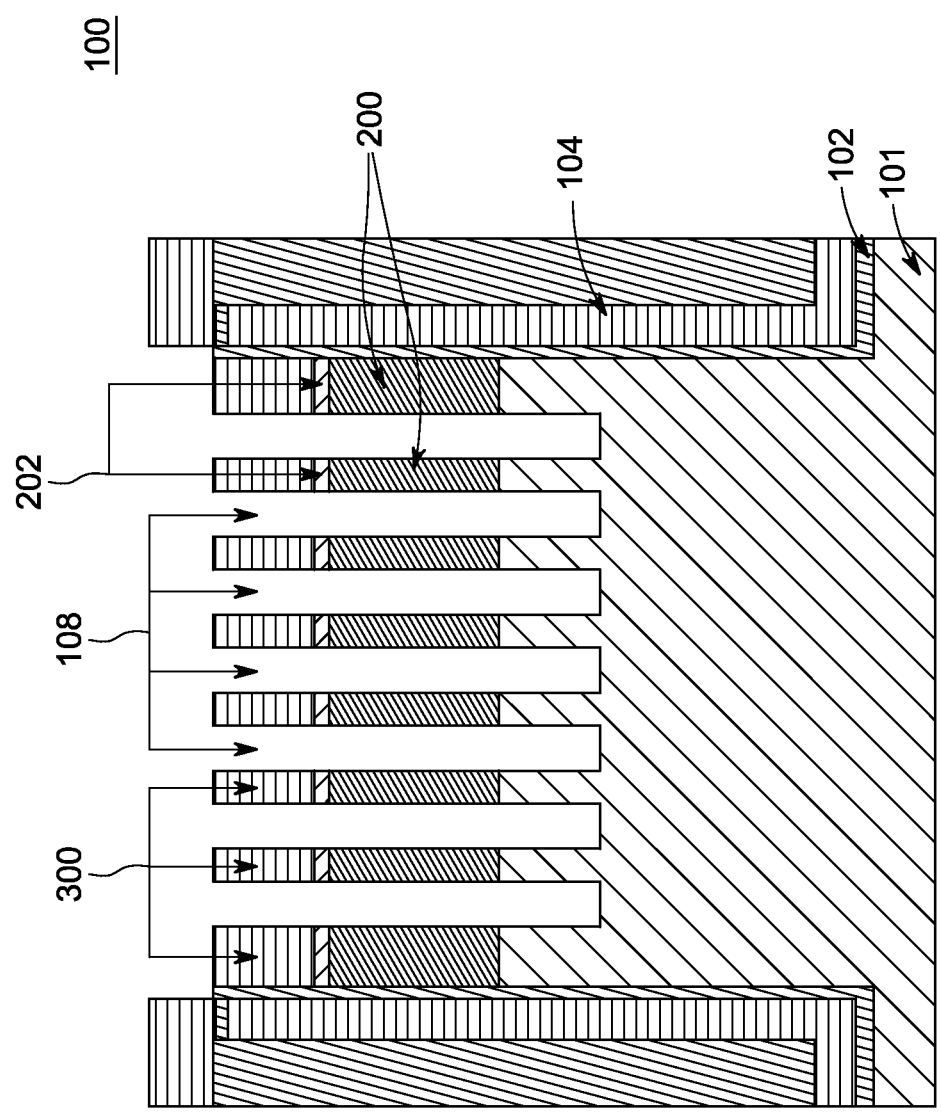

FIG. 4 illustrates a fourth step in the process of fabricating a gate for a BRAD in accordance with exemplary embodiments of the present invention. FIG. 4 depicts removal of the dummy gate electrodes 204 as shown in FIG. 2C. The dummy gate oxide 210 is removed from the trenches 108 using an etch selective to the oxide layer 102 and the polysilicon used for the dummy gate electrode 204, and not selective to the silicon nitride layer 300. Therefore, the oxide layer 210 and polysilicon 204 are removed, while the nitride layer 300 remains.

Figure 5A:
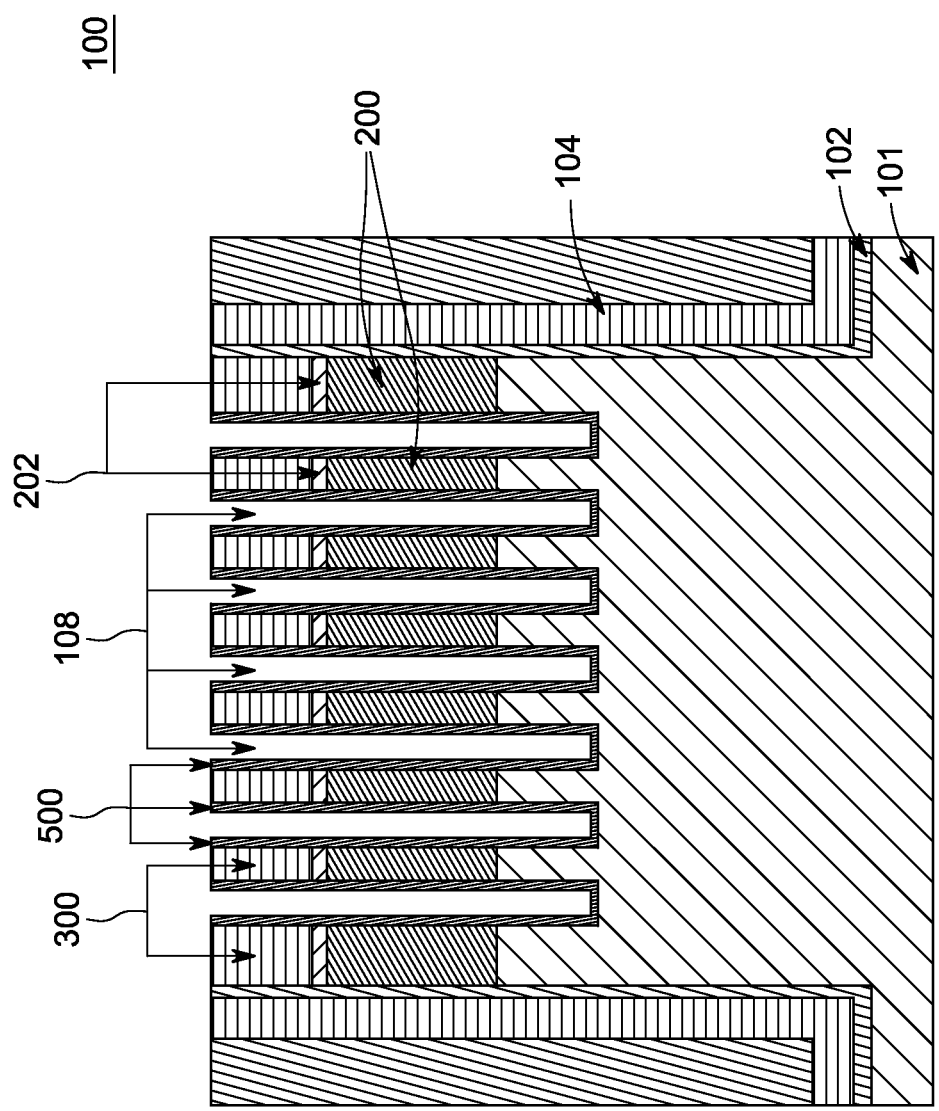
FIGS. 5A-5B illustrates a fifth step in the process of fabricating a gate for a BRAD in accordance with exemplary embodiments of the present invention.
Figure 5B:
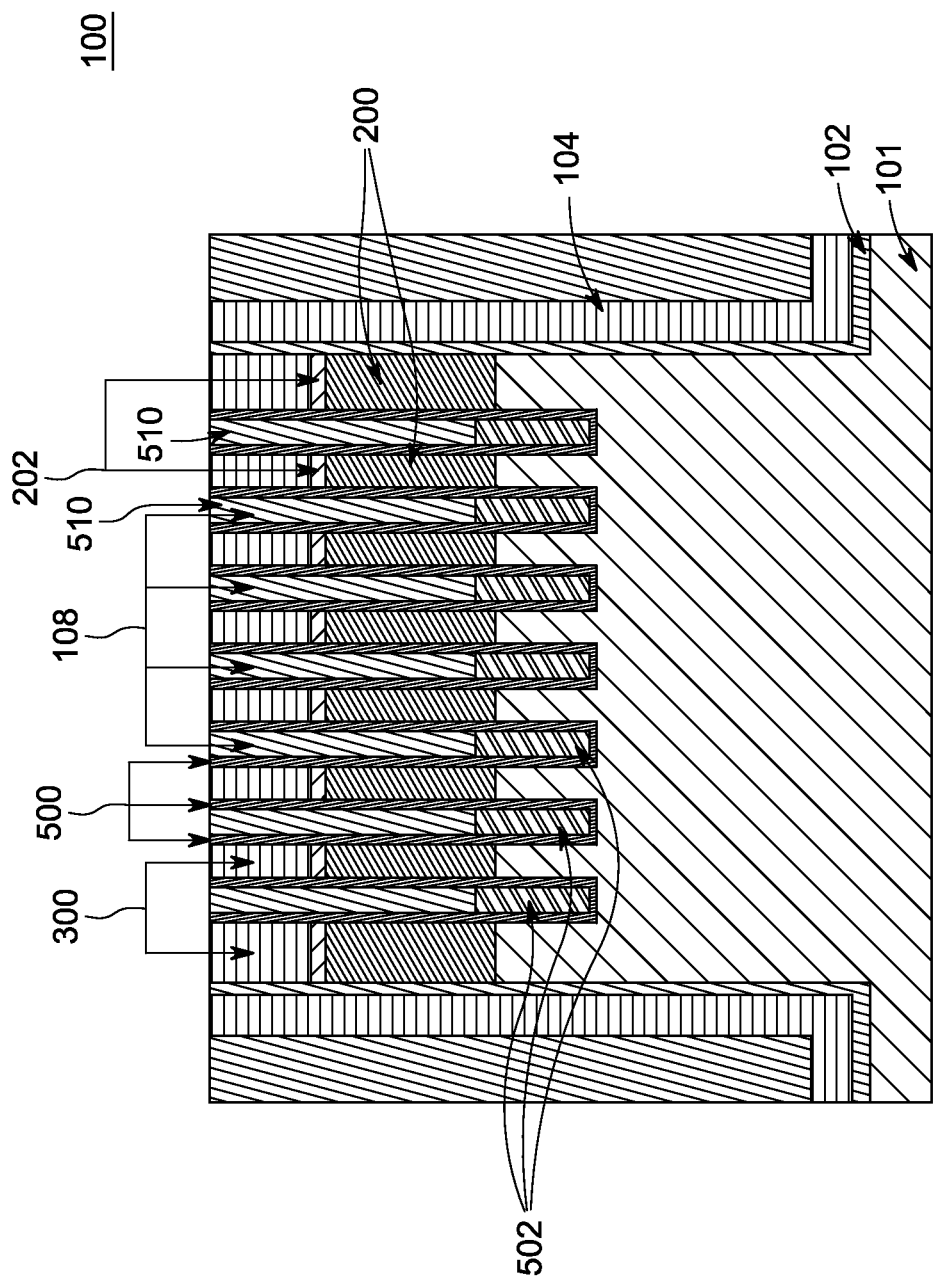

FIGS. 5A-5B illustrates a fifth step in the process of forming a BRAD in accordance with exemplary embodiments of the present invention. FIG. 5A depicts deposition of the high K dielectric layer 500 on the sides and bottom of etched trenches 108, after the oxide layer 210 and the dummy gate electrode 204 are removed in the fourth step of FIG. 4.

According to FIG. 5B, in place of the dummy gates 206, a metal gate 502 is deposited in the trenches 108 on the high K dielectric 500. According to exemplary embodiments, the metal gate 502 is composed of TiN, Ti, TiAlNi, TiSi, Ni, NiSi, Hf, HfSi, W, Ta, TaSi, Co, CoSi, Ru, AlN or the like. After the metal gate 502 is deposited and selectively etched to control the overlap distance between the source/drain regions 200 and the metal gate 502, an oxide layer 510 is filled on the metal gate 502 in the trenches 108.

Figure 6:
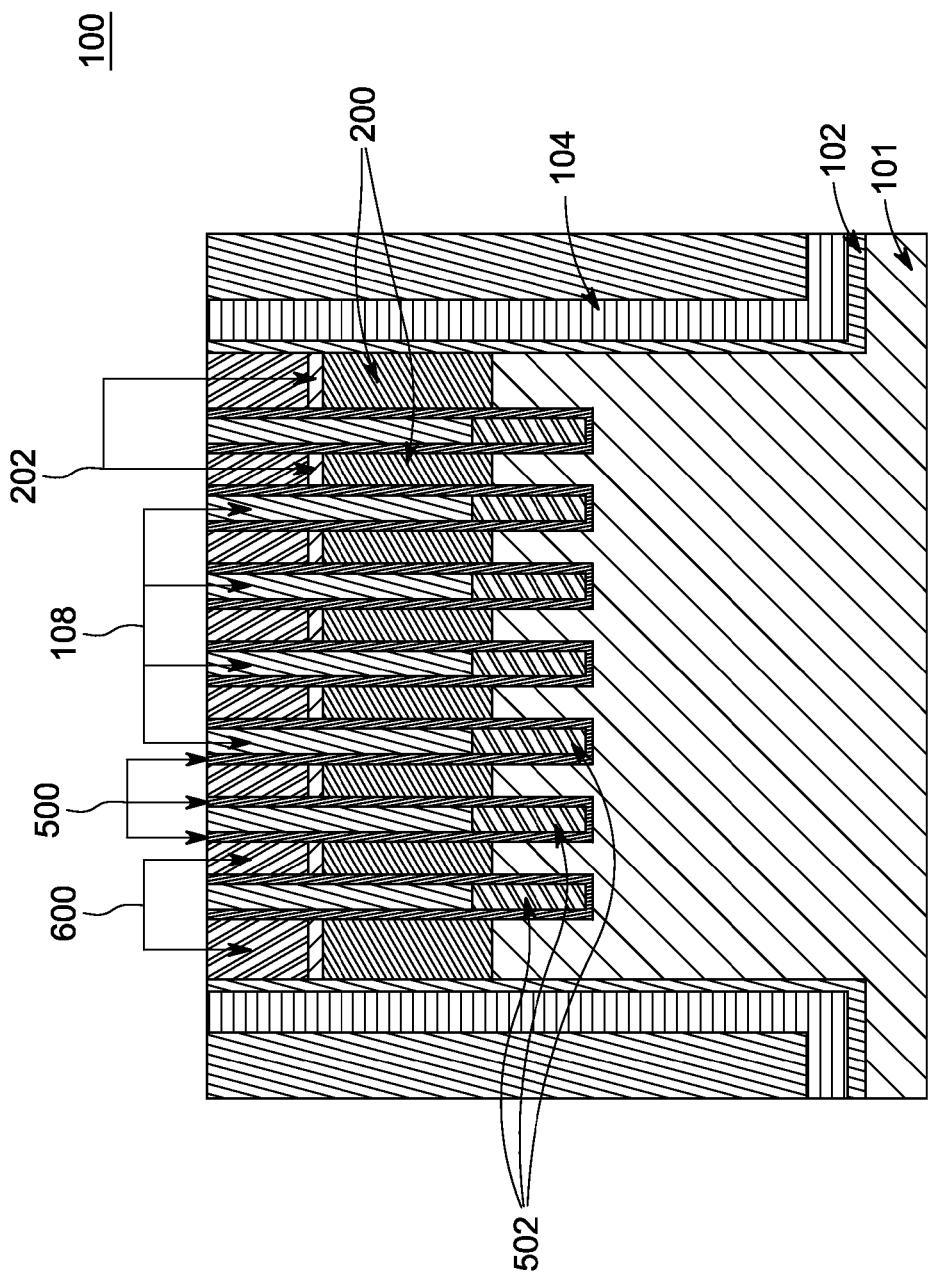

FIG. 6 illustrates a sixth step in the first process of fabricating a gate for a BRAD in accordance with exemplary embodiments of the present invention. FIG. 6 depicts forming the electrode 600 from the silicon nitride 300 stacked on the source/drain region 200. The silicon nitride 300 is selectively removed by a dry etch or a wet etch to leave the oxide layer 510, the high K dielectric 500 and the silicide layer 202. A metal layer 300 is deposited on the substrate 101. Then the metal layer 300 is planarized by CMP to electrically isolate the metal layer 600 on the source/drain regions 202. The metal layer 600 works as a contact to connect between the source/drain regions 202 and interconnections. Subsequently, other well known steps in semiconductor processing are performed to complete the device 100. In addition, a memory cell is electrically connected to either node of the source region or the drain.

As stated above with regard to FIGS. 1-6, the high temperature thermal treatments to activate the source/drain region 200 and form the silicide layer 202 are performed before the formation of the metal gate 502. A low temperature process is provided for the metal gate 502 to avoid the shift of work function.

FIGS. 7A-12 illustrate a second process of fabricating a gate for a BRAD 700 according to an exemplary embodiment of the present invention. According to this embodiment, SiO2 dummy gates are used and gate trenches are formed after the formation of the source/drain regions.

Figure 7A:
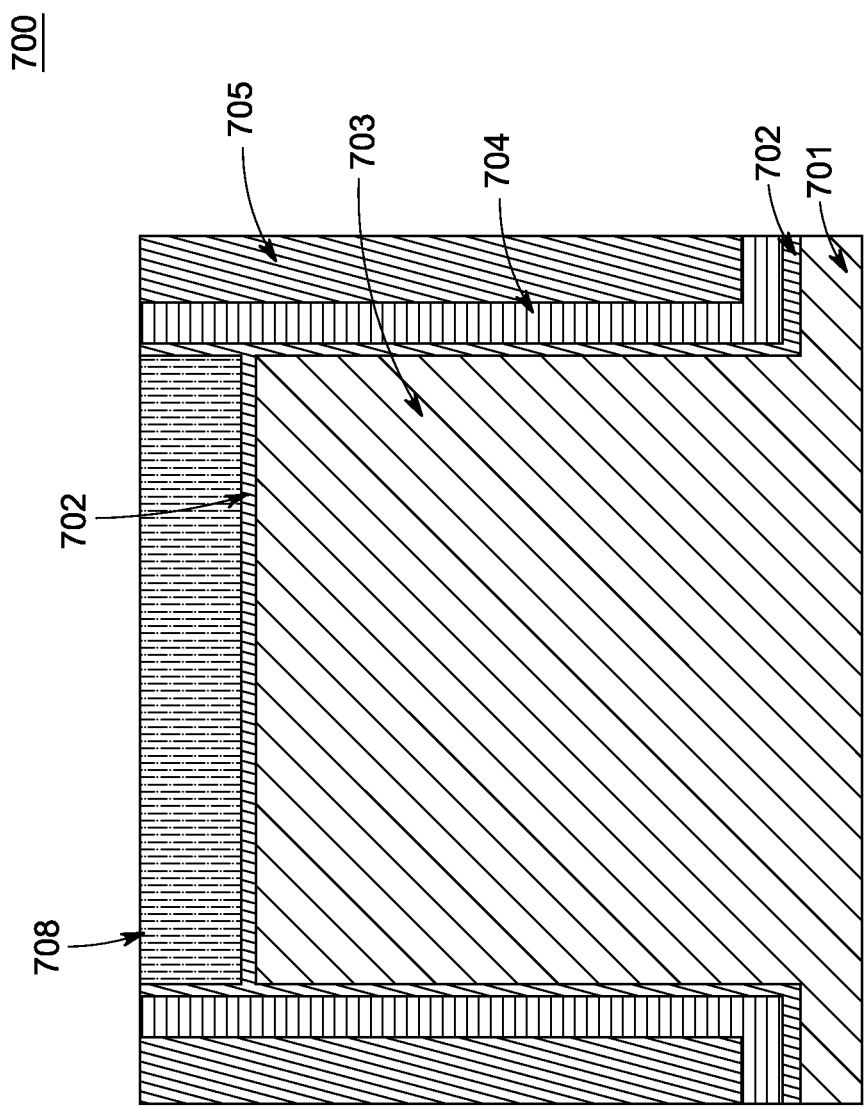
FIGS. 7A-7B illustrate a first step in the second process of fabricating a gate for a BRAD according to an exemplary embodiment of the present invention.
Figure 7B:
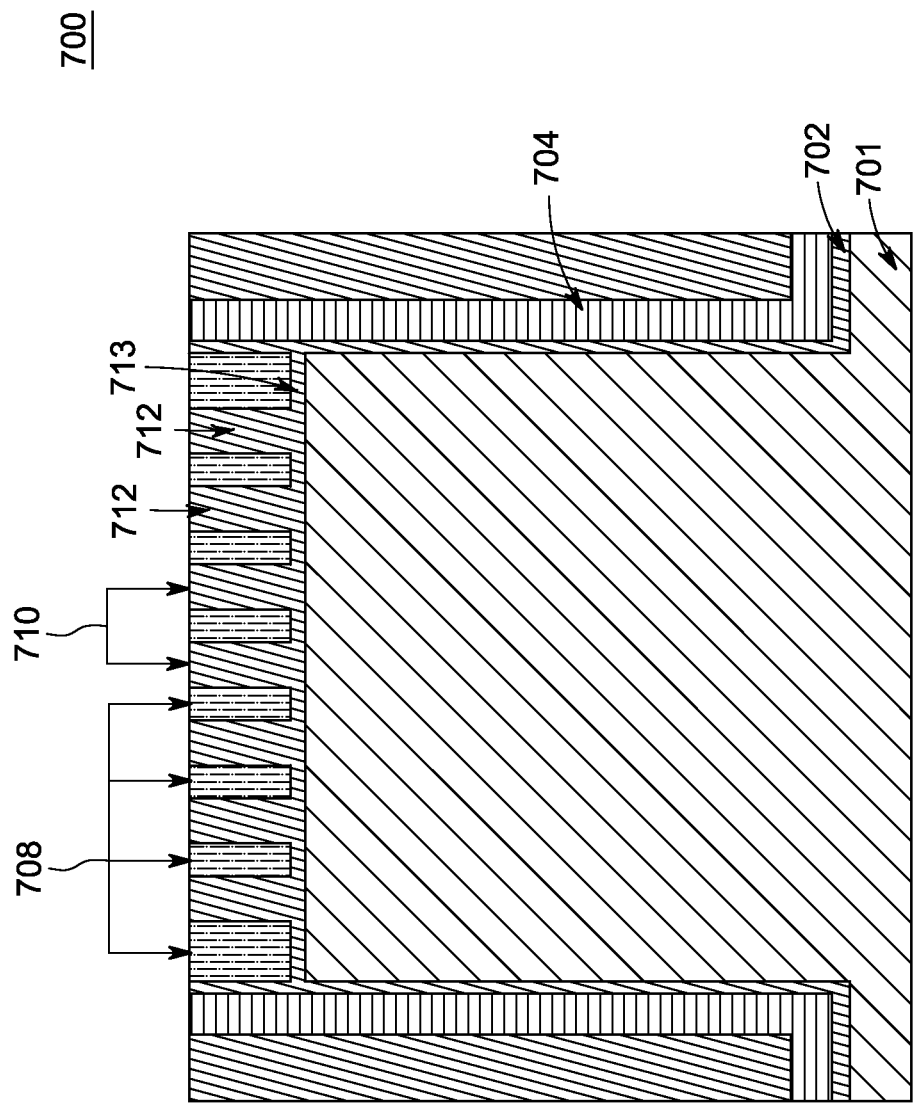

FIGS. 7A-7B illustrates a first step in the second process of fabricating a gate for a BRAD 700 according to an exemplary embodiment of the present invention. Initially, the device 700 comprises a silicon substrate 701. A silicon region 702 is formed on the substrate 701. An oxide layer 702 is conformally deposited on the silicon region 703. According to exemplary embodiments, the oxide layer 702 is comprised of silicon oxide (SiO2). According to exemplary embodiments of the present invention, an additional STI (not shown) is also formed in the back of the silicon region 703 to adjust the width of the BRAD.

A silicon oxide layer 702 and a polysilicon layer 708 are deposited on the substrate region 703. The STI is then formed by a silicon oxide layer 702, a silicon nitride layer 104 and a silicon oxide layer 705, deposited atop the substrate 701, respectively. BRADs and other devices like transistors, capacitors and resistors in substrate 701 are isolated by the STI.

In FIG. 7B, a lithographic process forms a mask on the polysilicon layer 708. As the masking material etches through the polysilicon layer 708 the initial trenches 710 are formed in the polysilicon layer 708. Then, a second oxide layer 712 is filled in the initial trenches 710 to act as dummy gate oxides. The oxide layer (e.g., SiO2) 712 effectively forms dummy gates.

Figure 8:
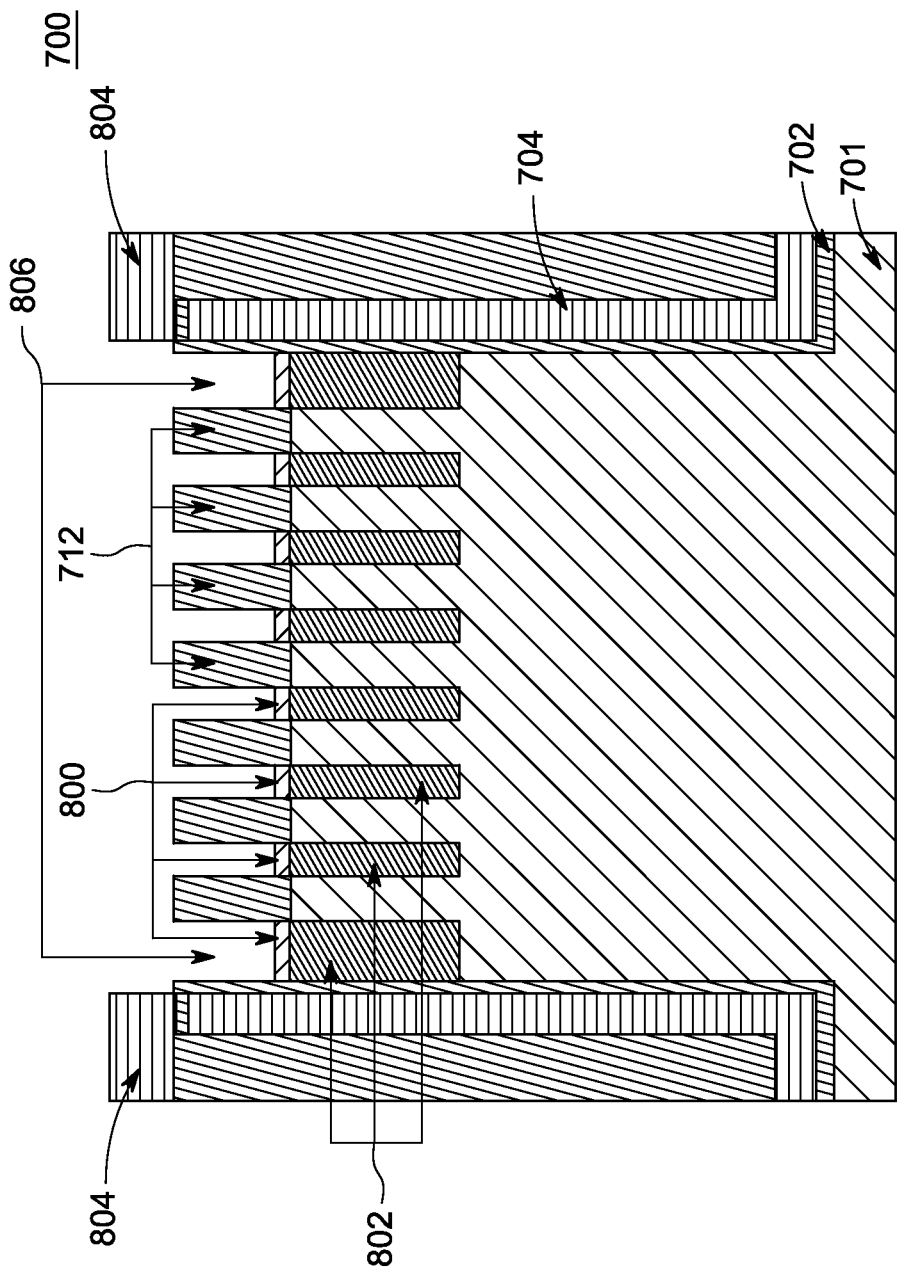

FIG. 8 illustrates a second step in the second process of fabricating a gate for a BRAD 700 according to an exemplary embodiment of the present invention. In this step, a silicon nitride layer 804 patterned by lithograph and dry etch is formed only to open the silicon region 703 like the first process. Then, the polysilicon deposited on the active areas is removed using an etch selective to polysilicon, while the oxide layer 712 remains leaving empty regions 806. The oxide layer 713 also remains after the formation of the empty regions 806.

The source/drain regions 802 are implanted into the substrate 701 through the oxide layer 713 between the areas defined by the oxide columns 710, i.e. regions 806. Then a thermal treatment is performed to activate the implanted impurities in the source/drain regions 802. The oxide columns 710 works as dummy gates to form the source/drain regions 802. In addition, no formation of the trenches for the dummy gates helps the reduction of defects in the source/drain regions 802, resulting in improved impurity activation.

Subsequently, the oxide layer 713 is removed on the source/drain region 802. Silicidation is then performed on the source/drain regions 820 to form a silicide layer 800. Ti, Co, Ni and Pt are used with a thermal treatment greater than 500 degree C. and cleaning steps are performed to form the silicidation layer, according to well-known conventional processes.

Figure 9:
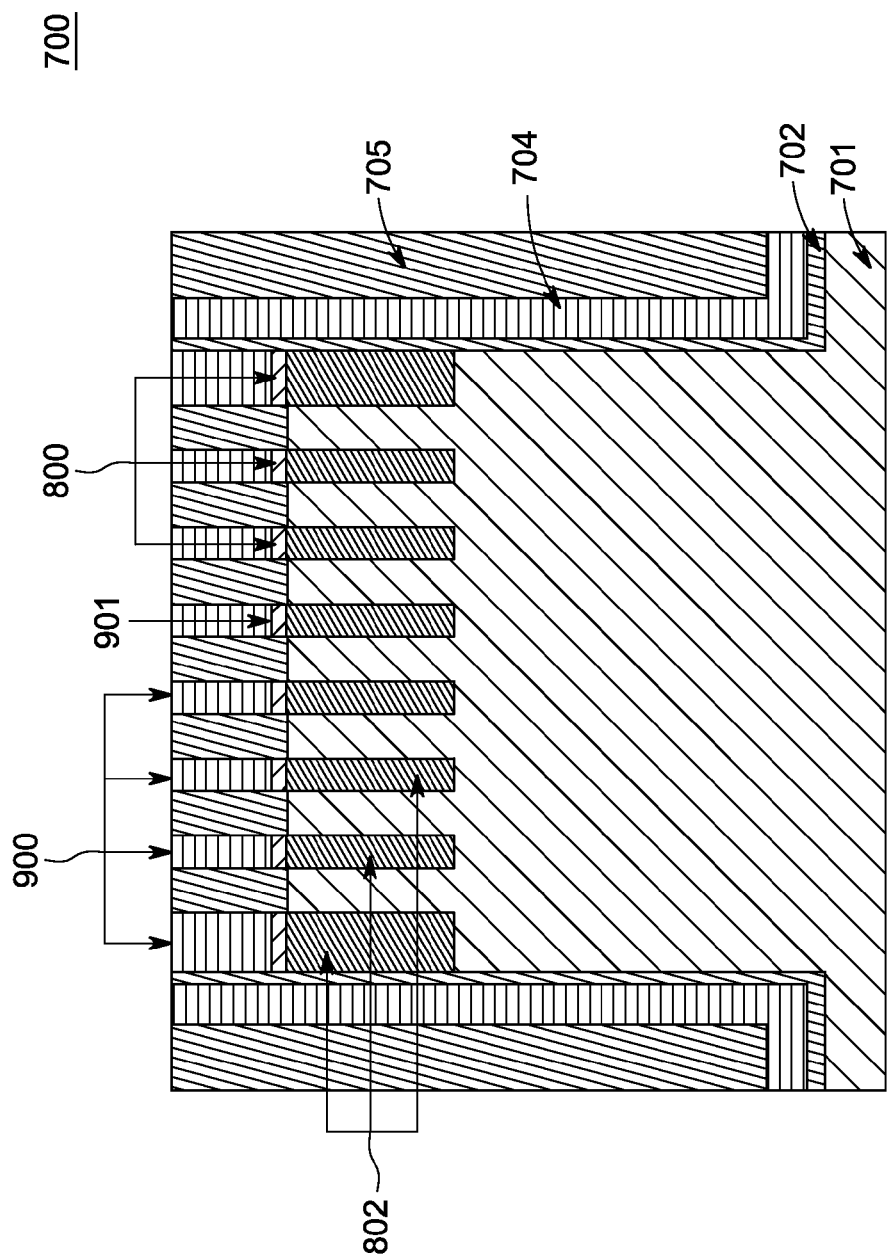

FIG. 9 illustrates a third step in the second process of fabricating a gate for a BRAD 700 according to an exemplary embodiment of the present invention. The previously empty regions 806 are deposited with a silicon nitride layer 900 to protect the silicide layer 800 during the below steps. The nitride layer 901 rises above the plane of the device 700 in some instances; therefore, a CMP process is then performed to polish the silicon nitride 900 on the dummy gate stack to planarize the surface of the device 700. In addition the silicon nitride layer 104 is also removed during the CMP.

Figure 10:
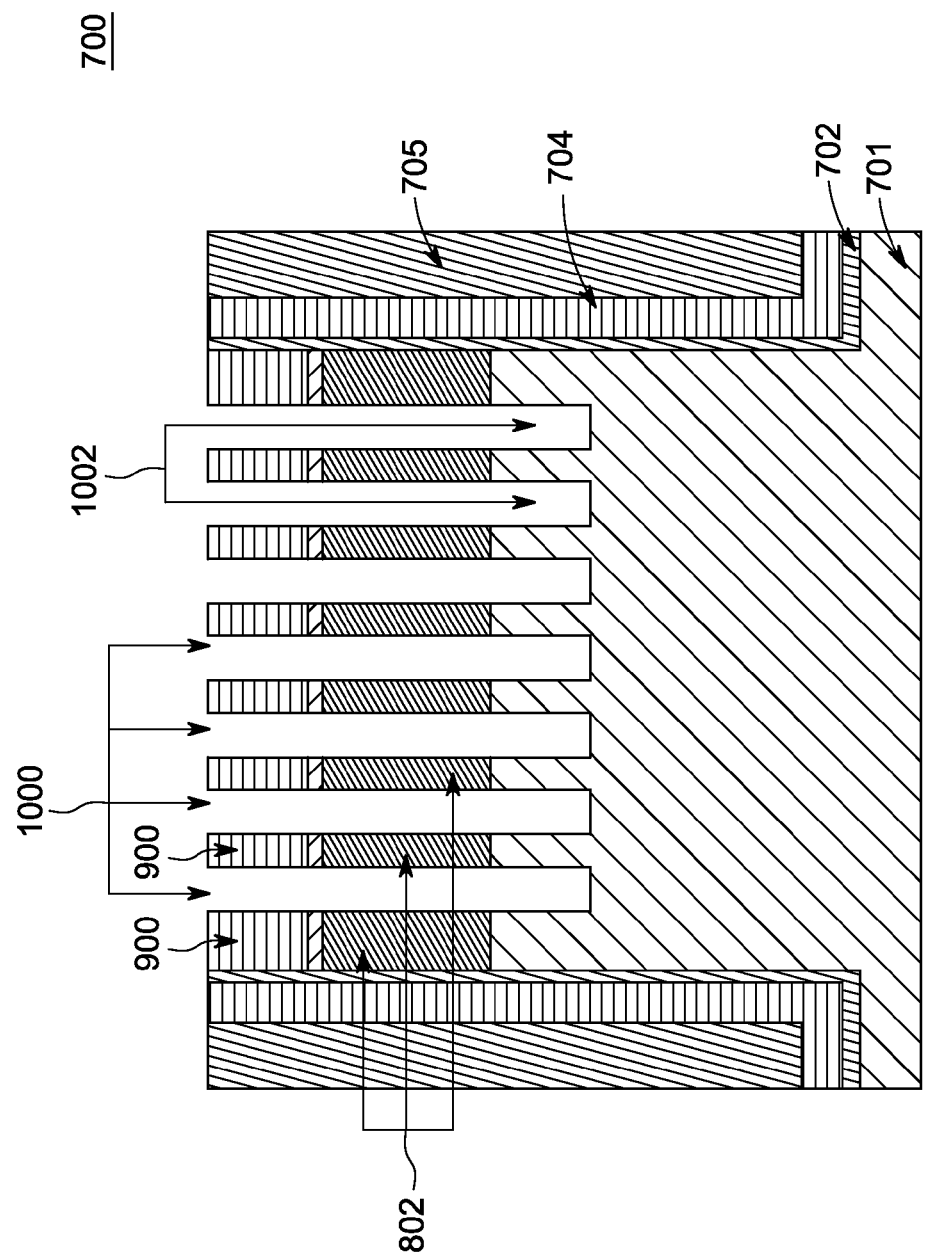

FIG. 10 illustrates a fourth step in the second process of fabricating a gate for a BRAD 700 according to an exemplary embodiment of the present invention. An etching process etches the silicon substrate 701 forming gate trenches 1002.

The etch is selective to the silicon, but not to the hard mask of the nitride layer 900 and the silicon oxide 705. According to some embodiments, the etching process is a dry etch process or a wet etch process. The gate trenches 1002 are etched deeper than the source/drain regions 802.

Figure 11A:
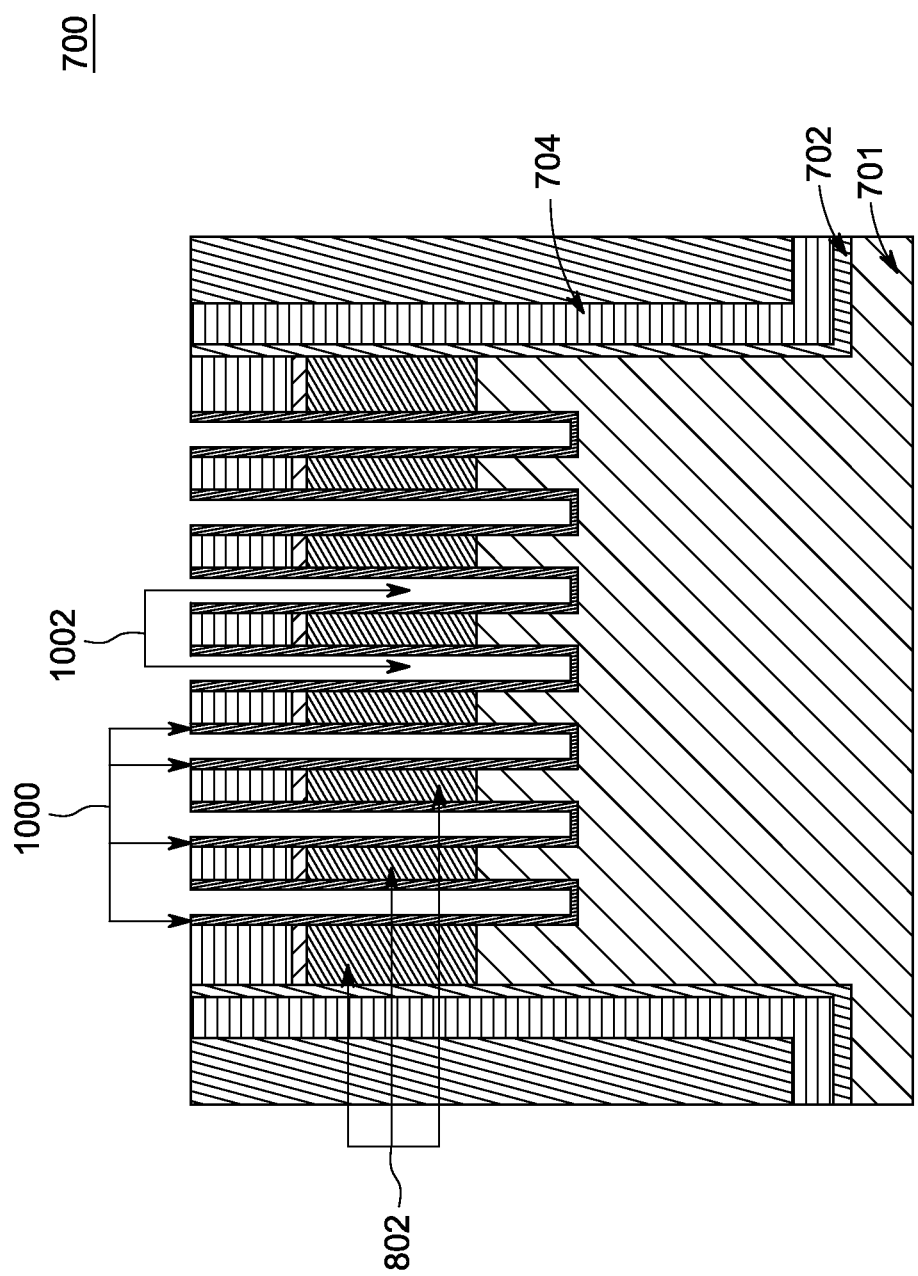
FIGS. 11A-11B illustrates a fifth step in the second process of fabricating a gate for a BRAD according to an exemplary embodiment of the present invention.
Figure 11B:
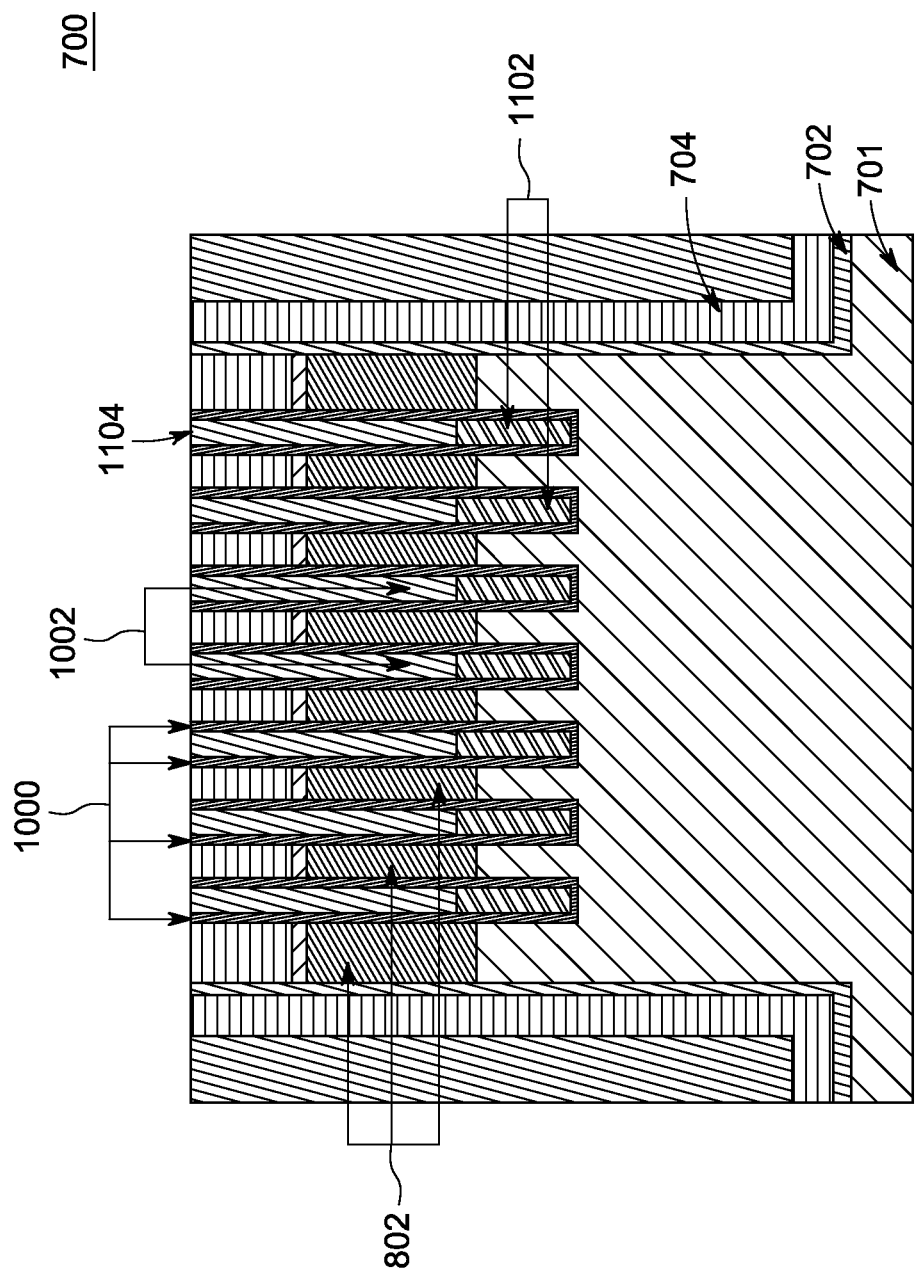

FIGS. 11A-11B illustrates a fifth step in the second process of fabricating a gate for a BRAD 700 according to an exemplary embodiment of the present invention. In FIG. 11A, the high K dielectric 1000 is deposited on the sides and the bottom of the trenches 1002. According to an exemplary embodiment, the high K dielectric may be HfO2, HfOIO2, HfSiO, Ta2O5, Al2O3, ZrO2 or the like.

In FIG. 11B, the metal gates 1102 are deposited on the high k dielectric 1000 in the trenches 1002. According to exemplary embodiments, the metal gate 502 is composed of TiN, Ti, TiAlNi, TiSi, Ni, NiSi, Hf, HfSi, W, Ta, TaSi, Co, CoSi, Ru, AlN or the like. Subsequently, the trenches 1002 are filled with an oxide layer 1104.

Figure 12:
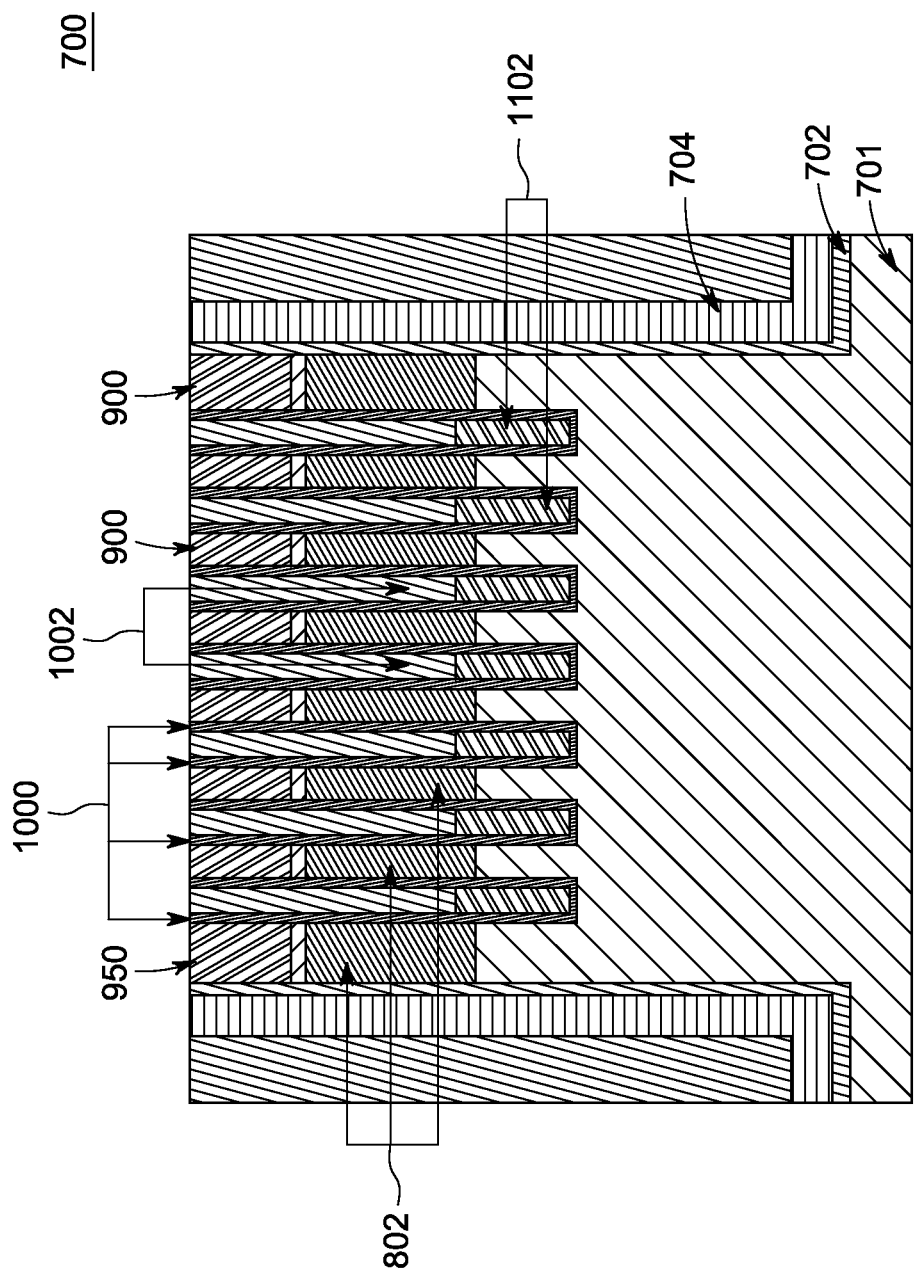

FIG. 12 illustrates a sixth and final step in the second process of fabricating a gate for a BRAD 700. The silicon nitride 900 is selectively removed by a dry etch or a wet etch to leave the oxide layer 1002, the high K dielectric 1000 and the silicide layer 800. A metal layer 950 is deposited on the substrate 701. Then the metal layer 950 is planarized by CMP to electrically isolate the metal layer 950 on the source/drain regions 802. The metal layer 950 works as a contact to connect between the source/drain regions 202 and interconnections. Subsequently, other well known steps in semiconductor processing are performed to complete the device 700. In addition, a memory cell is electrically connected to either node of the source region or the drain.

As discussed above with regard to the second process described in this invention, a low temperature process is provided for the metal gate 1102 to avoid the shift of the work function, because the high temperature thermal treatments to activate the source/drain region 802 and to form the silicide layer 800 are performed before the formation of the metal gate 1102.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for fabricating a gate for a buried recess access device comprising:
 depositing a first oxide layer on a substrate;
 depositing a polysilicon layer on the first oxide layer;
 masking the polysilicon layer with a pattern to produce an initial set of trenches;
 etching a plurality of gate trenches in the substrate;
 depositing a dummy gate in each of the plurality of gate trenches;
 filling the plurality of gate trenches with a second oxide layer;
 removing each dummy gate and depositing a high-K dielectric in the plurality of gate trenches;
 depositing a metal gate on the high-K dielectric in each of the plurality of gate trenches;
 depositing a third oxide layer on the metal gate;
 forming a contact a source/drain regions; and
 implanting and activating the source/drain regions prior to forming a gate stack comprising a metal electrode and high-k dielectric using a dummy gate stack as a mask for source/drain implantation.

2. The method of claim 1 further comprising, after the plurality of trenches is etched:
 depositing a fourth oxide layer in each of the plurality of trenches, prior to depositing the dummy gate in each of the plurality of trenches.

3. The method of claim 1 wherein an etching process is used to etch the plurality of gate trenches, the etching process being one of a dry etch or wet etch process.

4. The method of claim 1 further comprising:
 etching the polysilicon layer leaving the first oxide remaining above each source drain region; and
 performing silicidation on the source/drain region to form a plurality of dummy gate electrodes.

5. The method of claim 4 further comprising:
 depositing a silicon nitride layer on each of the plurality of dummy gate electrodes.

6. The method of claim 5 further comprising:
 polishing the silicon nitride using a chemical mechanical planarization (CMP) process.

7. The method of claim 2 further comprising:
 forming the dummy gate out of polysilicon; and
 forming all oxide layers using silicon oxide (SiO2).

8. The method of claim 1 wherein the metal gate is composed of one of titanium nitride, Ti, TiAlNi, TiSi, Ni, NiSi, Hf, HfSi, W, Ta, TaSi, Co, CoSi, Ru, AlN.

9. The method of claim 1 wherein the high-K dielectric is comprised of one of HfO2, HfOIO2, HfSiO, Ta2O5, Al2O3, ZrO2.

10. A method for fabricating a gate for a buried recess access device comprising:
 forming, a plurality of active areas on a first oxide layer deposited on a silicon substrate by:
  depositing the first oxide layer on the silicon substrate;
  depositing a polysilicon layer on the first oxide layer; and
  masking the polysilicon layer to form an initial set of trenches;
 implanting and activating source/drain regions prior to forming a gate stack comprising a metal electrode and high-k dielectric using a dummy gate stack as a mask for source/drain implantation;
 etching a plurality of gate trenches in the silicon substrate between each of the active areas;
 depositing a high-k dielectric layer on sides and a bottom of the plurality of gate trenches;
 depositing a metal gate on the high-k dielectric in each of the plurality of gate trenches; and
 forming a contact on the source drain regions in each of the plurality of gate trenches.

11. The method of claim 10 further comprising:
 depositing a second oxide layer in the initial set of trenches;
 after implanting and activating the source/drain region in the silicon substrate, etching the polysilicon layer using an etch selective to polysilicon leaving a remaining portion of the first oxide layer; and
 performing silicidation on the source/drain region to form a silicide layer.

12. The method of claim 11 further comprising:
 depositing a silicon nitride layer on the silicide; and
 polishing the silicon nitride on the silicide layer.

13. The method of claim 12 wherein the polishing is performed via a chemical mechanical planarization (CMP) process.

14. The method of claim 10 wherein the high K dielectric is composed of one of HfO2, HfOIO2, HfSiO, Ta2O5, Al2O3, ZrO2.

15. The method of claim 10 wherein the metal gate is composed of one of titanium nitride, Ti, TiAlNi, TiSi, Ni, NiSi, Hf, HfSi, W, Ta, TaSi, Co, CoSi, Ru, AlN.

* * * * *